United States Patent
Sukegawa et al.

(10) Patent No.: US 7,337,261 B2
(45) Date of Patent: *Feb. 26, 2008

(54) MEMORY APPARATUS CONNECTABLE TO A HOST SYSTEM HAVING A USB CONNECTOR

(75) Inventors: Hiroshi Sukegawa, Tokyo (JP); Azusa Kanayama, Tokyo (JP); Hiroyuki Kamei, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/402,908

(22) Filed: Apr. 13, 2006

(65) Prior Publication Data

US 2006/0184709 A1 Aug. 17, 2006

Related U.S. Application Data

(63) Continuation of application No. 10/355,214, filed on Jan. 31, 2003, now Pat. No. 7,069,370.

(51) Int. Cl.
G06F 13/14 (2006.01)
G06F 12/00 (2006.01)

(52) U.S. Cl. .................. 710/313; 710/305; 710/63; 710/74; 711/103

(58) Field of Classification Search .............. 710/13, 710/300–304, 72, 305, 38, 36, 313, 105, 710/63, 74; 439/518, 638, 884; 711/103, 711/115; 365/63, 129; 713/600; 361/686, 361/724, 726, 685, 737
See application file for complete search history.

(56) References Cited

U.S. PATENT DOCUMENTS 6,012,103 A 1/2000 Sartore et al.
6,148,354 A 11/2000 Ban et al.
6,246,578 B1 6/2001 Wei et al.
6,292,863 B1 9/2001 Terasaki et al.
6,370,603 B1 4/2002 Silverman et al.
6,385,677 B1 * 5/2002 Yao ............................ 711/115
6,654,841 B2 11/2003 Lin
6,733,329 B2 5/2004 Yang
6,757,783 B2 6/2004 Koh (Continued)

FOREIGN PATENT DOCUMENTS

JP 2001-216099 8/2001

(Continued)

OTHER PUBLICATIONS

"System-on-chip for mega-pixel digital camera processor with auto control functions" by Zhou et al. (abstract only) Publication Date: Oct. 21-24, 2003.*

(Continued)

*Primary Examiner*—Gopal C. Ray
(74) *Attorney, Agent, or Firm*—Finnegan, Henderson, Farabow, Garrett & Dunner, L.L.P.

(57) ABSTRACT

An integrated semiconductor memory device for use within an integrated USB memory apparatus has a controller, a flash memory in communication with the controller, a USB interface circuit in communication with the memory controller, and an integrated circuit package for maintaining at least one of the controller, the flash memory, and the USB interface within the physical dimensions of a USB connector of the USB memory apparatus.

12 Claims, 12 Drawing Sheets

U.S. PATENT DOCUMENTS

| | | | |
|---|---|---|---|
| 6,768,942 B1 | 7/2004 | Chojnacki | |
| 6,792,501 B2 | 9/2004 | Chen et al. | |
| 6,795,327 B2 | 9/2004 | Deng et al. | |
| 6,813,164 B2* | 11/2004 | Yen | 361/785 |
| 6,829,672 B1 | 12/2004 | Deng et al. | |
| 6,854,984 B1* | 2/2005 | Lee et al. | 439/79 |
| 6,880,054 B2 | 4/2005 | Cheng et al. | |
| 6,900,988 B2* | 5/2005 | Yen | 361/737 |
| 6,908,038 B1* | 6/2005 | Le | 235/492 |
| 7,044,802 B2* | 5/2006 | Chiou et al. | 439/660 |
| 7,069,370 B2* | 6/2006 | Sukegawa et al. | 710/305 |
| 2002/0147882 A1* | 10/2002 | Pua et al. | 711/103 |
| 2003/0005278 A1 | 1/2003 | Deng et al. | |
| 2004/0153595 A1* | 8/2004 | Sukegawa et al. | 710/305 |
| 2006/0026348 A1* | 2/2006 | Wallace et al. | 711/115 |
| 2006/0184709 A1* | 8/2006 | Sukegawa et al. | 710/313 |

FOREIGN PATENT DOCUMENTS

| | | |
|---|---|---|
| KR | 2001-0071332 | 7/2001 |
| KR | 2003-0004022 | 1/2003 |

OTHER PUBLICATIONS

Koh, "Memory device packaging—from leadframe packages to wafer level packages," Jun. 30-Jul. 3, 2004.

* cited by examiner

MEMORY APPARATUS CONNECTABLE TO A HOST SYSTEM HAVING A USB CONNECTOR

This is a continuation application of U.S. patent application Ser. No. 10/355,214, filed Jan. 31, 2003 now U.S. Pat. No. 7,069,370, which is incorporated herein by reference.

FIELD OF THE INVENTION

This invention generally relates to memory storage devices and, more specifically, to an improved USB memory storage apparatus that uses an integrated semiconductor device incorporated within a USB connector shield case.

BACKGROUND OF THE INVENTION

The Universal Serial Bus, conventionally referred to as USB, is a bus standard for inexpensively connecting external peripheral devices to a personal computer. USB provides an expandable, hot-pluggable serial interface that ensures a standard, low-cost connection for peripheral devices such as keyboards, mice, joysticks, printers, scanners, storage devices, modems, and the like. The popularity of the USB standard is evident as most computer manufacturers now include one or more USB interfaces for external USB peripherals as part of their systems. Commentators in the computer industry have noted that the USB standard is becoming the market's dominant I/O connectivity standard.

USB specification version 2.0 is the present generation of this peripheral connection for personal computers. It is intended as an upgrade for USB 1.1. The new standard provides additional bandwidth for multimedia and storage applications and also offers Plug-and-Play capability and full backward compatibility for legacy USB devices. USB 2.0 has a raw data rate at 480 Mbps, and it is rated 40 times faster than its predecessor interface, USB 1.1, which tops at 12 Mbps. Originally, USB 2.0 was intended to go only as fast as 240 Mbps, but then, USB 2.0 Promoter Group increased the speed to 480 Mbps in October 1999.

Taking advantage of this quick connectivity standard are a variety of memory storage apparatus, one of which being a USB flash drive. In general, the USB flash drive is a small memory storage apparatus that interfaces with a host system through a USB connector. The apparatus uses low power non-volatile flash memory as its storage media instead of conventional rotating hard disk media. Examples of prior art USB flash drives include the M-Systems DiskOnKey™ 32 MB product and the Lexar JumpDrive™ 2.0 Pro.

In prior art USB flash drives, the systems typically use a USB connector (including an internal circuit board with contact terminals), an external circuit board for mounting the drive's other electrical components, and a protective exterior casing surrounding the external circuit board. Typically, the drive's other electrical components include a controller circuit, flash memory, a clock source, and various discrete components (such as de-coupling capacitors, surface mount resistors, and a light). The controller circuit may include interfacing circuitry for the flash memory and the USB host but sometimes such interfacing circuitry is implemented separately from the controller. In order to protect these components on the external circuit board, the protective exterior casing projects out from the USB connector to cover the external circuit board and the components mounted on it.

One problem in prior art USB flash drives is the large number of parts required to construct the drive. This typically results in undesirably high material and manufacturing costs for the drive. Additionally, the large number of parts cause the physical size of the drive to become undesirably large and cumbersome. The resulting size and configuration of such a prior art USB flash drive can often be inconvenient because the drive must extend out from the USB host system's mating USB connector interface. For example, many computers systems do not have much room for large, protruding peripheral devices attached to their external USB interface. If the USB host system is a desktop computer system situated against a wall, inserting such a prior art USB flash drive may require pulling the computer away from the wall into an undesirable new location that protrudes into the user's workspace. Likewise, if the USB host system is a laptop computer with a USB interface on the side of the laptop, inserting such a prior art drive on the side may protrude into the working area of the user's neighbor when on an airplane. As a result, laptop computers may be used in an environment where the ability to connect a protruding USB flash drive is limited to impossible.

Even when a prior art USB flash drive is connected to the back or side of a laptop computer, there is a real danger that the USB flash drive may snap off or break at the connector due to its unsupported protruding physical configuration. A user may accidentally bump the inserted USB flash drive and crack the connection between the USB connector and the external circuit board because the USB connector is the only part of the USB flash drive sufficiently supported relative to the laptop. Alternatively, a peripheral or power cord may get wrapped around the inserted USB flash drive on the back of the laptop and break the USB flash drive at the connector when the cord is accidentally pulled.

Accordingly, there is an urgent need for an improved USB flash drive that is reduced in size, is less expensive, and avoids possible damage to the drive from unsupported situations.

SUMMARY OF THE INVENTION

In accordance with one aspect of the invention, an integrated semiconductor memory device for use within a USB memory apparatus is described comprising a controller, a flash memory in communication with the controller, a USB interface circuit in communication with the memory controller, and an integrated circuit package for maintaining the controller, the flash memory, and the USB interface together within the physical dimensions of a connector of the USB memory apparatus.

In accordance with another aspect of the invention, an integrated USB memory apparatus is described comprising a USB connector shield case, a first circuit board disposed within the USB connector shield case, a set of contact terminals on a top side of the first circuit board, and a semiconductor device disposed within the USB connector shield case and in electrical communication with the set of contact terminals. The semiconductor device comprises at least a memory controller in communication with the set of contact terminals, a NAND flash memory in communication with the memory controller, and a USB interface circuit in communication with the memory controller.

In accordance with yet another aspect of the invention, an integrated USB memory apparatus is described, comprising a USB connector shield case, a first circuit board disposed within the USB connector shield case, a set of contact terminals on a substantially flat portion of a top side of the first circuit board, a block disposed on the first circuit board within the USB connector shield case for preventing over-insertion of a mating USB connector, and a semiconductor device disposed within the USB connector shield case and in electrical communication with the set of contact terminals, and a light operatively coupled to the semiconductor device to provide a visual indication of access to the NAND flash memory. The semiconductor device at least comprises a memory controller in communication with the set of contact terminals, a NAND flash memory in communication with the memory controller, and a USB interface circuit in communication with the memory controller.

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

In general, an embodiment of the present invention implements the electrical components of the USB flash drive apparatus within an integrated semiconductor circuit package that is mounted within the USB connector shield case. In this way, the number of parts within the USB flash drive is reduced and the physical size of the drive can be drastically reduced such that all or a majority of the apparatus' circuitry is incorporated within the USB connector shield case.

Figure 1:
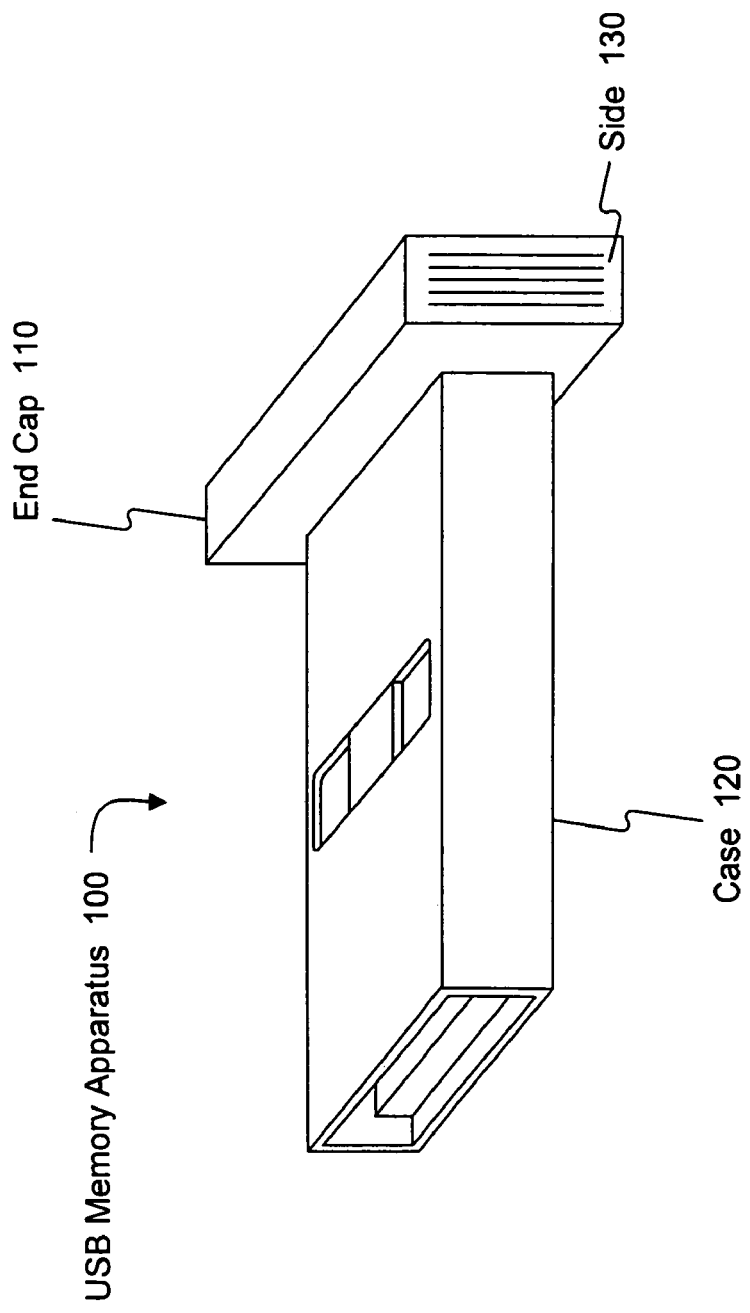
FIG. 1 is an exterior illustration of an exemplary Universal Serial Bus (USB) memory storage apparatus according to an embodiment of the present invention.

FIG. 1 is an exterior illustration of an exemplary USB memory storage apparatus according to an embodiment of the present invention. Referring now to FIG. 1, exemplary USB memory apparatus 100 is an integrated flash drive apparatus shown with a USB connector shield case 120. The circuit components of the flash drive apparatus can be mounted within case 120 in various configurations. By doing so, there is no need for an external circuit board or substantial structure outside the USB connector shield case 120. In this embodiment, the USB connector shield case 120 is from a USB Series A plug. A set of contact terminals (shown in more detail in FIG. 4A-C) is disposed within the connector shield case 120 is in a known configuration to line up with a mating USB connector.

Attached to the USB connector shield case 120 is an end cap 110. End cap 110 can be used as a handle to pull the apparatus out from the host system's USB connection or interface. In the embodiment illustrated in FIG. 1, ridged side surfaces 130 of end cap 110 provide a gripping surface so that a user can grab hold of the apparatus 110 when inserting or removing it from the host system. In this embodiment, end cap 110 is made of a molded plastic typically with a logo on an exterior surface. Additionally, end cap 110 may have an opening to expose one or more lights that indicate connection to the host system, access to the apparatus' memory or both.

In other embodiments, end cap 110 may differ in shape and material. In one alternative embodiment, end cap 110 may have rounded corners or edges on its exposed corners and edges instead of sharp corners or edges that may pose a potential hazard. In another alternative embodiment, end cap 110 may be made of a clear material. The use of such a clear material provides an advantageously unobstructed view of the interior of end cap 110, which may have a logo or other marking on an end of the USB connector shield case 120 or some other part disposed within the USB connector shield case 120. In some instances, it may also be advantageous to incorporate a clear lens-like structure as part of the end cap 110 to provide an aided view of the logo or other marking within the end cap 110. In a further alternative embodiment, end cap 110 may be made of a visually opaque material capable of reflecting light in many directions when the apparatus is being accessed or simply when the apparatus has been properly inserted within the host system. In this manner, the different types of end caps in embodiments of the invention provide a relatively low-profile, unobtrusive, and compact exterior for use with reduced size USB flash drive apparatus.

Figure 2:
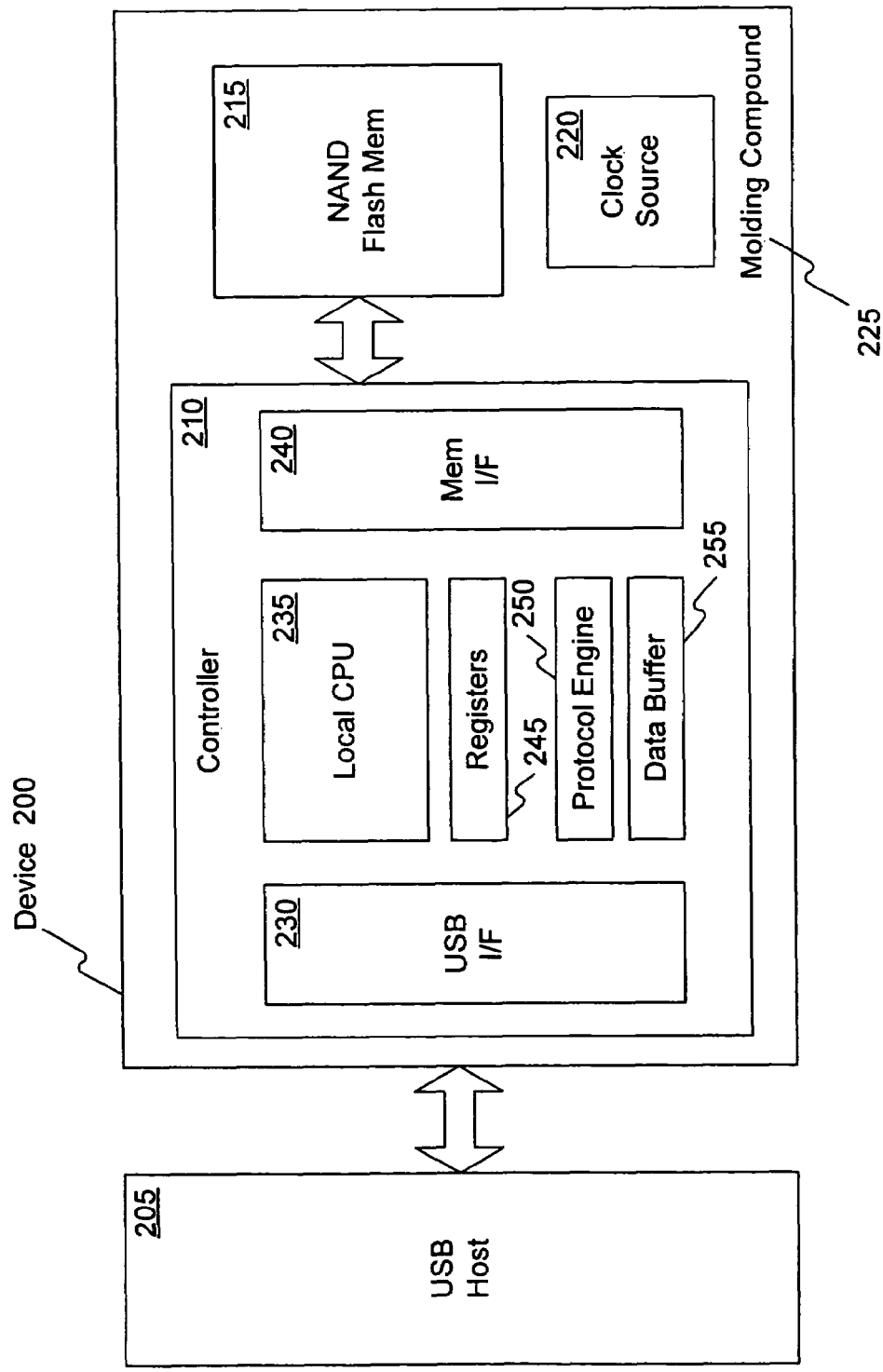
FIG. 2 is a block diagram of exemplary circuit components for a USB memory storage apparatus according to an embodiment of the present invention.

FIG. 2 shows a block diagram of exemplary circuit components for an integrated USB memory apparatus and how they may be advantageously incorporated into a semiconductor device according to an embodiment of the present invention. Referring now to FIG. 2, an exemplary semiconductor device 200 is shown connected to a USB host system 205. In this embodiment, the electrical circuits that make up the integrated USB memory apparatus are integrated within the device 200 so that they can fit within a USB connector (or at least have a majority of the circuits mounted within the USB connector shield case). These circuits include, but are not necessarily limited to, a memory controller 210, NAND flash memory 215, and a clock source 220.

The controller 210 typically includes a USB interface circuit 230 for handling communications with the USB host 205. In this embodiment, USB interface circuit 230 is incorporated as part of controller 210 but those skilled in the art will appreciate that other embodiments may implement USB interface circuit 230 outside of controller 210. Controller 210 also typically includes a local central processing unit (CPU) 235, a memory interface 240, registers 245, and a protocol engine 250, and a data buffer 255. The local CPU 235 controls and manages the USB memory apparatus 100 in response to commands received from USB host 205. Memory interface 240 typically includes driver and receiver circuitry to facilitate the exchange of data between controller 210 and NAND flash memory 215. Controller 210 sets appropriate values or flags in the registers 245 to control operations of the USB interface 230 and/or the memory interface 240. During processing of host commands and exchange of data with the NAND flash memory 215, controller 210 uses the data buffer 255 as temporary storage locations. Likewise, controller 210 uses protocol engine 250 to control data transfer between the USB apparatus 100 and the USB host 205 when processing such host commands under a variety of conditions, such as bulk-transfers, interrupt-driven transfers, isochronous transfers, and the like. For example, the protocol engine 250 facilitates with any serial to parallel conversion as data is received from the USB host in a serial format but may be transferred to the NAND flash memory in parallel fashion.

These components of controller 210 are typical circuits used for accessing data stored in non-volatile flash memory, such as NAND flash memory 215. NAND flash memory 215 may include bi-level memory cells or multi-level memory cells. One example of such NAND flash memory 215 is Toshiba 512 Mbit NAND flash memory chip. For increased capacity in a limited physical dimension, the NAND flash memory 215 with the capacity of 1 Mbit or more can be formed on a single silicon die. Increased capacity may also be achieved by manufacturing the NAND flash memory 215 under the design rule of 0.12 micron meter or less. While the non-volatile flash memory used in this embodiment is NAND flash memory, those skilled in the art will appreciate that other kinds of non-volatile flash memory, for example, AND flash memory or NOR flash memory, can be used in other embodiments of the invention.

The clock source 220 may be any clock generating circuitry, such as a crystal oscillator or a frequency synthesizer. While a crystal oscillator circuit may require a bulky frequency crystal, the use of a frequency synthesizer may be better suited to save physical space within the USB connector shield case.

Additionally, one or more lights (not shown) may also be connected to the controller 210 within device 200 to provide an indication that the device 200 is properly connected to USB host 205 and if NAND flash memory 215 is being accessed. In one embodiment, the light may be an LED incorporated into the end cap 110 and wired to the controller 210. In other embodiments, the light may be implemented as one or more display devices (e.g., one or more discrete LED's, an integrated group of LED's, a small LCD display on the end of the USB connector shield case, etc.) that provides the desired indications to the user.

Those skilled in the art will understand that other conventional circuit elements (not shown) may be added to the components discussed above to implement a USB flash drive within the device 200 according to an embodiment of the invention. These other conventional circuit elements may include, but are not limited to, discrete components (such as de-coupling capacitors) and conventional parts of the circuits mentioned above (such as a voltage regulator within controller 210 or an internal memory buffer within NAND flash memory).

Figure 3:
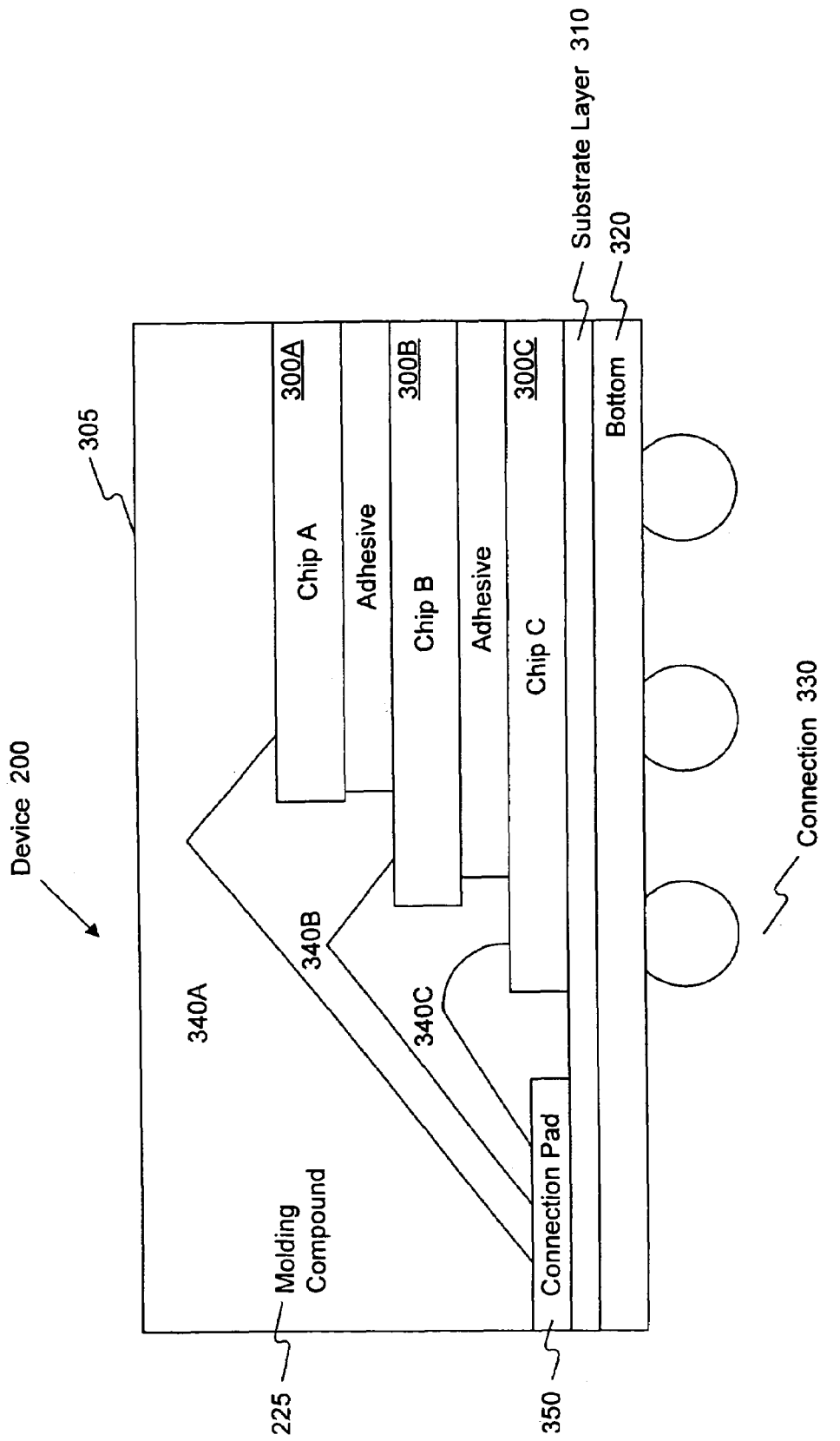
FIG. 3 is a side view diagram of an integrated semiconductor memory device for stacking multiple circuit modules and filling with molding compound or resin according to an embodiment of the present invention.

In the illustrated embodiment of FIGS. 1 and 2, a single semiconductor device 200 can be used to house these electrical circuit components. To accomplish this, the electrical circuit components may be implemented as one or more interconnected circuit modules, which may be held in place with a molding compound 225 or resin within the device. FIG. 3 shows an example of how an integrated semiconductor memory device, such as device 200, can stack multiple interconnected smaller devices (referred to as chips) and fill the remaining space within the device with molding compound or resin according to an embodiment of the present invention. Referring now to FIG. 3, device 200 is illustrated as a multi-chip package 305 where chip A 300A is glued on top of chip B 300B, which is then further glued on top of chip C 300C. Chip C 300C is attached to a substrate layer 310 above the bottom 320 of device 200. Each of chips 300A-C may be insulated from each other and are connected to one or more connection pads 350 using wires 340A-C, respectively. Further, these connections may be in communication with solder connections 330 disposed on the bottom 320 of the device 200. While FIG. 3 shows sires 340A-340C by wire-bonding, those skilled in the art will appreciate that connections from chips A-C to connection pads may be implemented with other electrical interconnection techniques, such as by through-holes and solder bumps.

Those skilled in the art will appreciate that the solder connections 330 are solder balls or bumps for use in surface mounting the device 200 and that other connection topologies are contemplated for use in other embodiments of the invention. In one embodiment, the package 305 is implemented by a conventional P-FBGA package. However other conventional and new packages may be used to implement embodiments of the invention depending on the available physical space within the USB connector and the desired functionality of the memory apparatus.

While FIG. 3 shows device 200 implemented within one integrated circuit package, other embodiments of the present invention contemplate implementing the electrical circuit components in distinct and separate circuit modules that can be electrically connected when mounted within different parts of the USB connector. In other words, alternative embodiments of the present invention may implement the device in separate modules (each of which may be a multi-chip package have one or more chips) to more readily take advantage of the limited available space within the physical confines of the USB connector shield case.

Figure 4A:
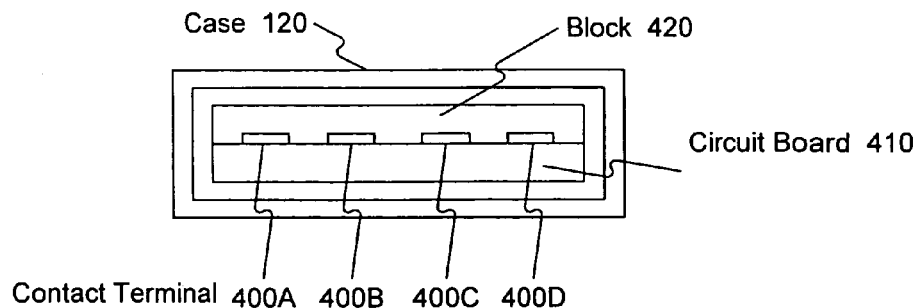
FIG. 4A is an end view illustration of an exemplary first circuit board having a set of contact terminals and resin block disposed within a USB connector shield case according to an embodiment of the present invention.
Figure 4B:
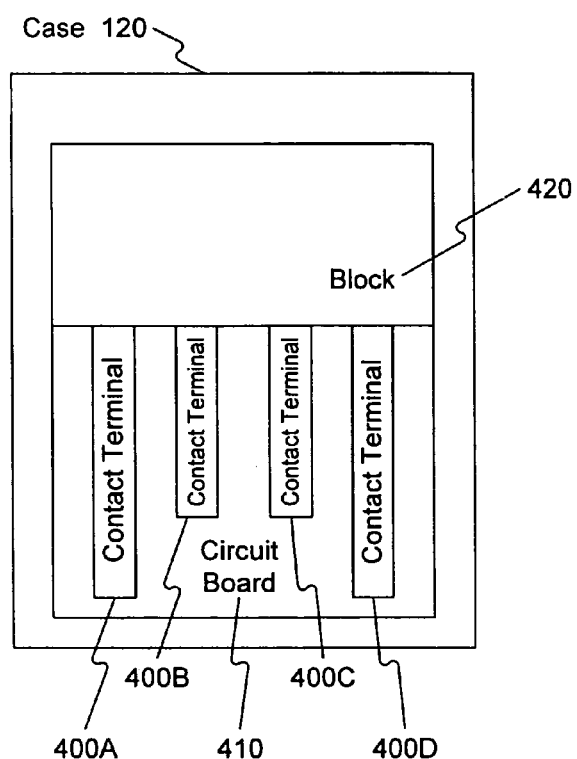
FIG. 4B is a top view illustration of the exemplary first circuit board and set of contact terminals from FIG. 4A.
Figure 4C:
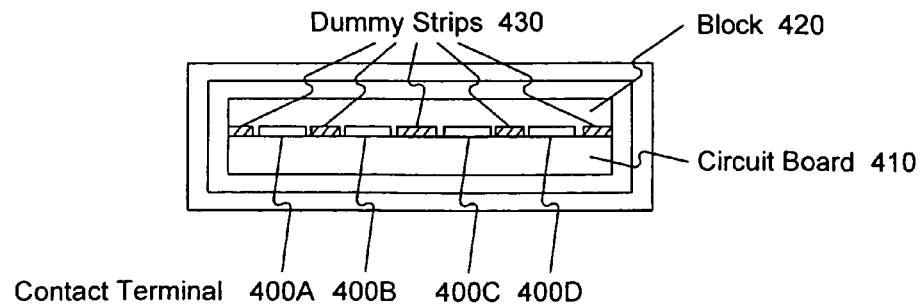
FIG. 4C is an end view illustration of another embodiment of the contact terminals having dummy contact strips between the real contact terminals according to an embodiment of the invention.

What follows is a description of various mechanical configurations of the device (implemented as one or more modules) within the USB connector. FIGS. 4A-4C are illustrations of an exemplary USB connector shield case and parts disposed within it according to embodiments of the invention. Referring now to FIG. 4A, exemplary USB connector shield case 120 is shown from an end view perspective. In this embodiment, the USB connector is a Series A Plug connector for use in connecting to host systems on the upstream. As indicated in the USB 2.0 Specification, the Series A Plug includes a Plug Housing (more generally referred to as a USB connector shield case 120) that extends from an overmold boot (not shown) on an end of the connector opposite the contact terminals 400A-D. The overmold boot is typically an injection molded thermoplastic insulator material with a minimum UL 94-VO rating.

The USB connector shield case 120 for the Series A Plug measure 12 millimeters (mm) wide±0.10 mm, 4.5 mm tall±0.10 mm, and a minimum of 11.75 mm deep. It is contemplated that other embodiments of the case 120 may vary in dimension somewhat, but especially with regard to the depth dimension. Those skilled in the art will further appreciate that other style connectors, such as the USB Series B Plug, may be used in embodiments of the present invention as well.

A set of contact terminals 400A-D is shown disposed on a portion of the top side of a first circuit board 410 within the USB connector shield case 120. As shown in FIG. 4B, the set of contact terminals 400A-D are arranged in a standard USB configuration to line up with a mating USB interface or connector. In this manner, terminal 400A is deemed to be ground, terminal 400B is deemed to be +D, terminal 400C is deemed to be –D, and terminal 400D is deemed to be $+V_{BUS}$ according to the USB standard. In the Series A Plug embodiment illustrated in FIGS. 4A-C, the first circuit board is Further, FIG. 4B shows a block 420 disposed on the opposite end of the USB connector shield case and first circuit board 410. This block 420, which may be part of the first circuit board 410 or implemented as a separate piece, is used to prevent over-insertion of a mating USB connector. The block is typically made of a hard resin compound to be resilient when it comes in contact with the mating USB connector. However, as shown and discussed later with regard to FIGS. 5B, C, F, and G, the block may be hollowed out to house and support one or more circuit modules that make up the semiconductor device of the USB flash drive apparatus.

FIG. 4C is an illustration of an alternative embodiment of the present invention where the contact terminals are accompanied with dummy gold strips 430 interspersed in between the real contact terminals 400A-D. In this way, there is no need to remove the dummy strips 430 from the this substantially flat portion of the first circuit board 410. This may provide a more advantageous manufacturing detail when constructing the apparatus.

Figure 5A:
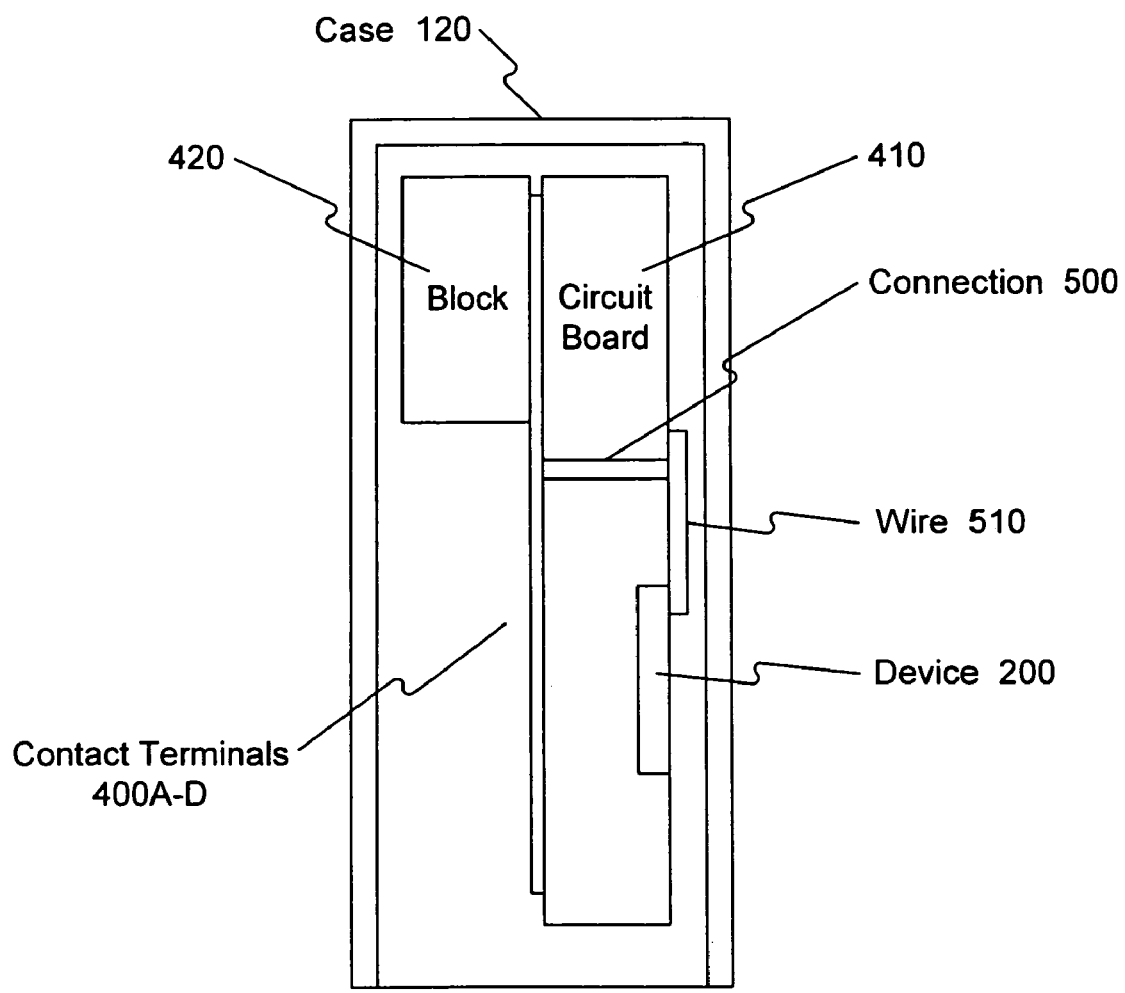
FIG. 5A is a diagram of an exemplary configuration of a first circuit board, a set of contact terminals, a resin block, and a memory storage semiconductor device mounted on the bottom side of the first circuit board according to an embodiment of the present invention.
Figure 5B:
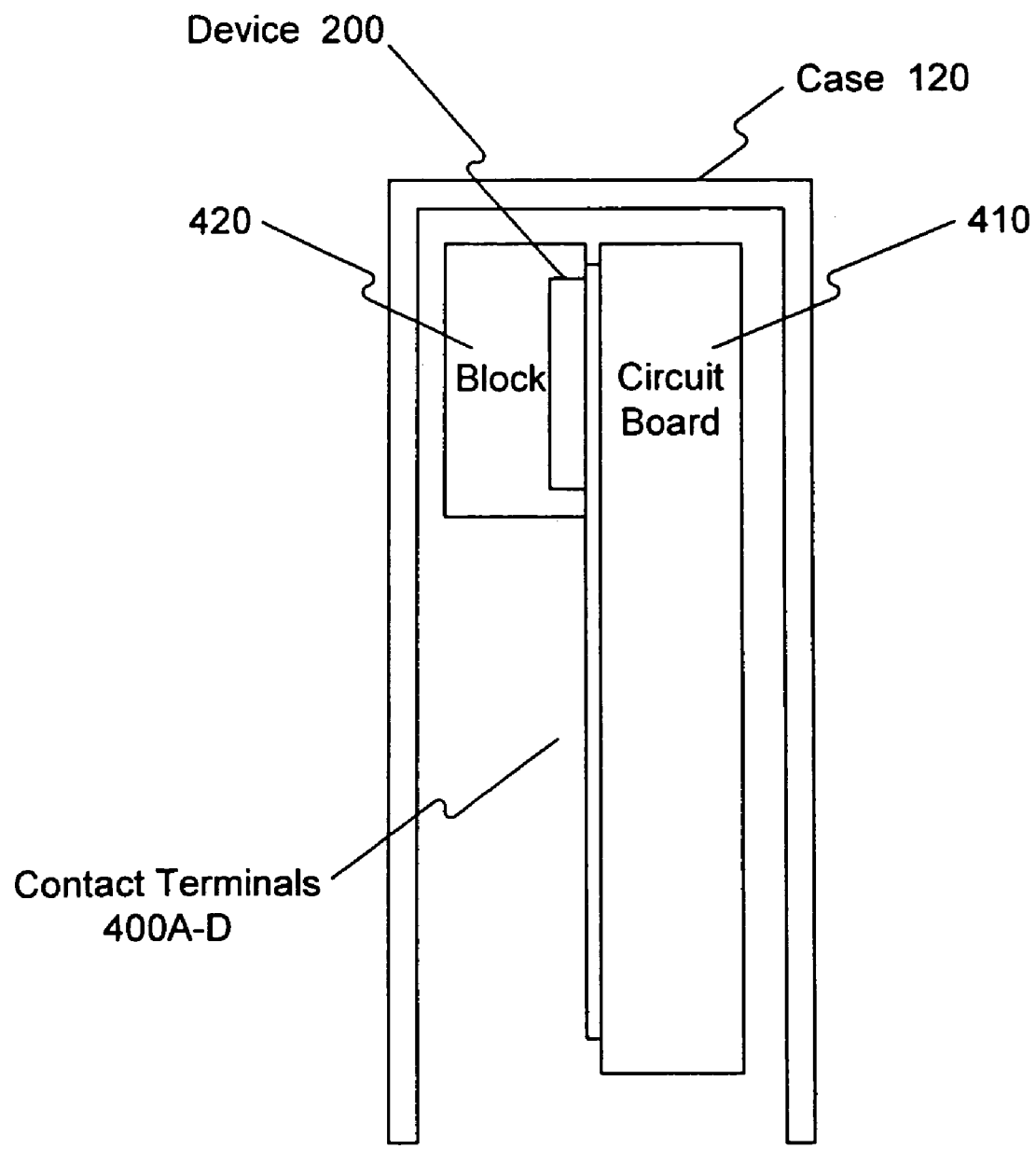
FIG. 5B is a diagram of an exemplary configuration of a first circuit board, a set of contact terminals, a resin block, and a memory storage semiconductor device mounted within the resin block according to an embodiment of the present invention.
Figure 5C:
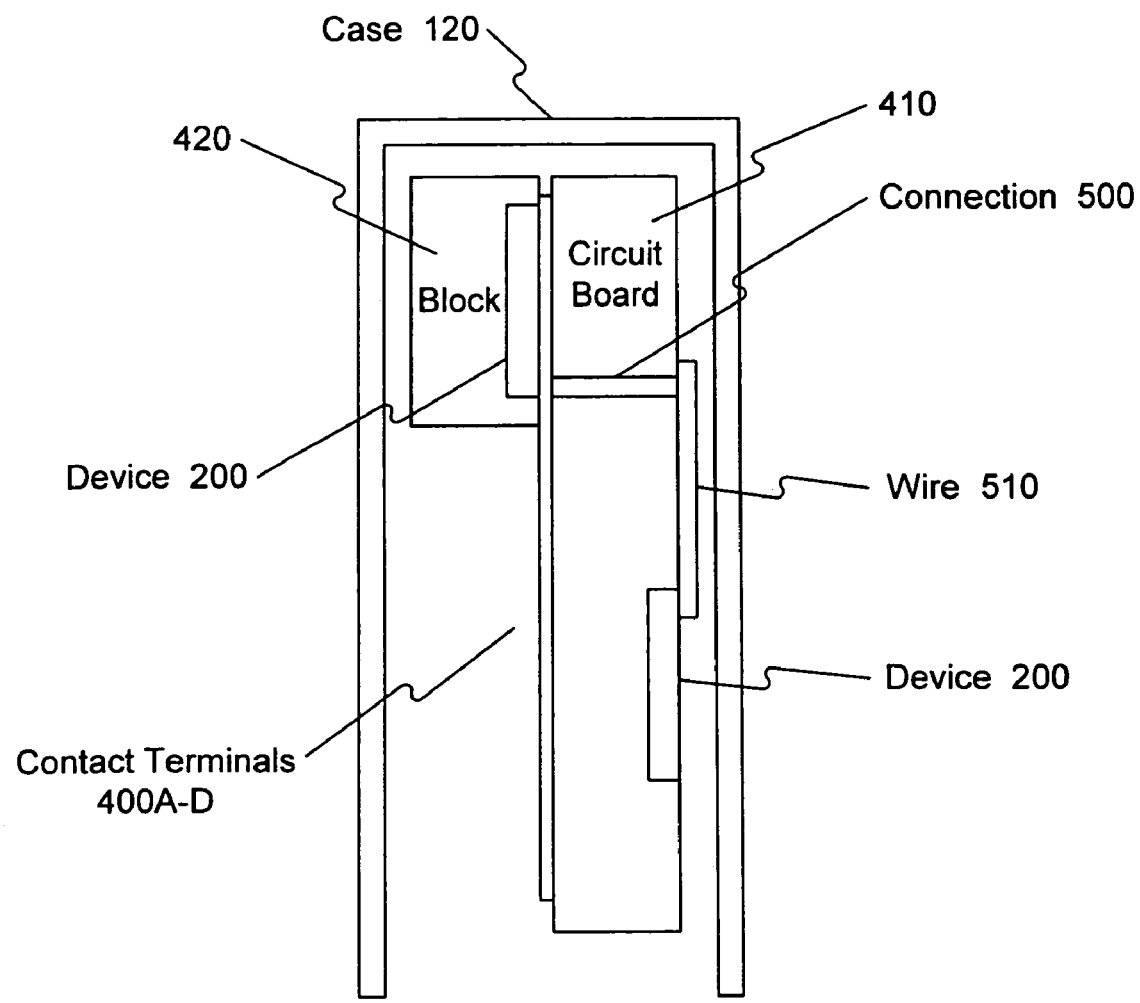
FIG. 5C is a diagram of an exemplary configuration of a first circuit board, a set of contact terminals, a resin block, and a memory storage semiconductor device implemented with two circuit modules, where one module is mounted within the resin block and the other module collectively making up the device is mounted on the bottom side of the first circuit board according to an embodiment of the present invention.

FIGS. 5A-5G show how the device, implemented as one or more modules, can be mounted within the exemplary USB connector shield case according to different embodiments of the invention. FIG. 5A is a diagram of an exemplary configuration of a first circuit board 410, a set of contact terminals 400A-D, a resin block 420, and a memory storage semiconductor device 200 mounted on the bottom side of the first circuit board according to an embodiment of the present invention. In this configuration, the device 200 is implemented as a single module conveniently attached to the bottom side of the first circuit board 410. To achieve this configuration, a circuit board interconnection or via 500 to a trace or wire 510 on the bottom side of the board 410. FIG. 5B shows a configuration that locates the single module device 200 within the block 420 instead of on the bottom of the first circuit board 410. FIG. 5C shows a configuration where the device 200 is implemented with two modules, one being mounted on the bottom side of the first circuit board 410 and the other being mounted within the block 420.

In some situations, it may be advantageous to add a second circuit board for use in mounting certain circuit modules. Typically, the second circuit board is kept within the confines of the USB connector shield case. However, it is contemplated that the second circuit board may be disposed outside the USB connector shield case but within close proximity to the case and within the end cap. This is another example of how a majority of the structure for the memory apparatus can be kept within the USB connector shield case.

Figure 5D:
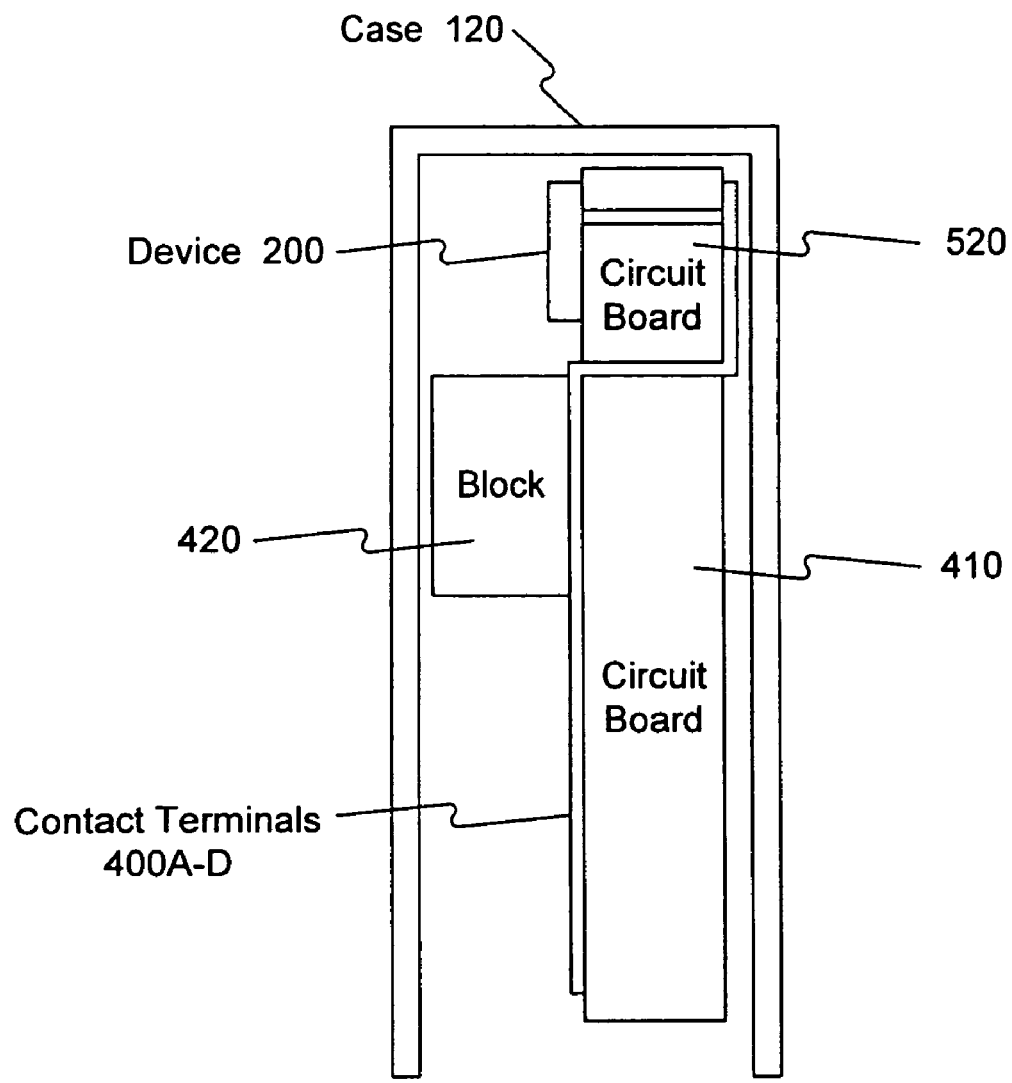
FIG. 5D is a diagram of an exemplary configuration of a first circuit board, a set of contact terminals, a resin block, a second circuit board, and a memory storage semiconductor device mounted on the second circuit board according to an embodiment of the present invention.
Figure 5E:
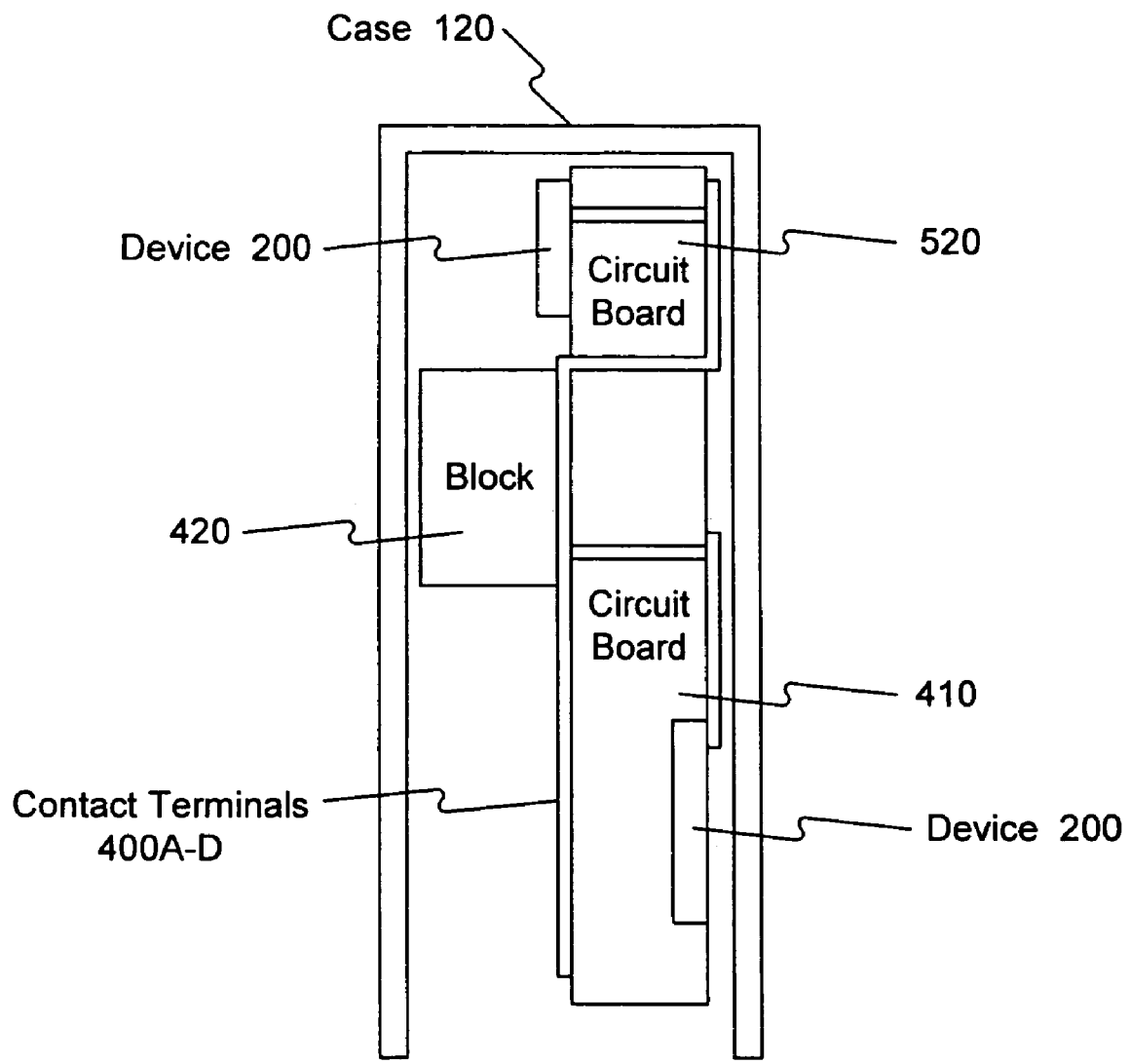
FIG. 5E is a diagram of an exemplary configuration of a first circuit board, a set of contact terminals, a resin block, a second circuit board, and a memory storage semiconductor device having two circuit modules, where one module is mounted on the second circuit board and the other module collectively making up the device is mounted on the bottom side of the first circuit board according to an embodiment of the present invention.
Figure 5F:
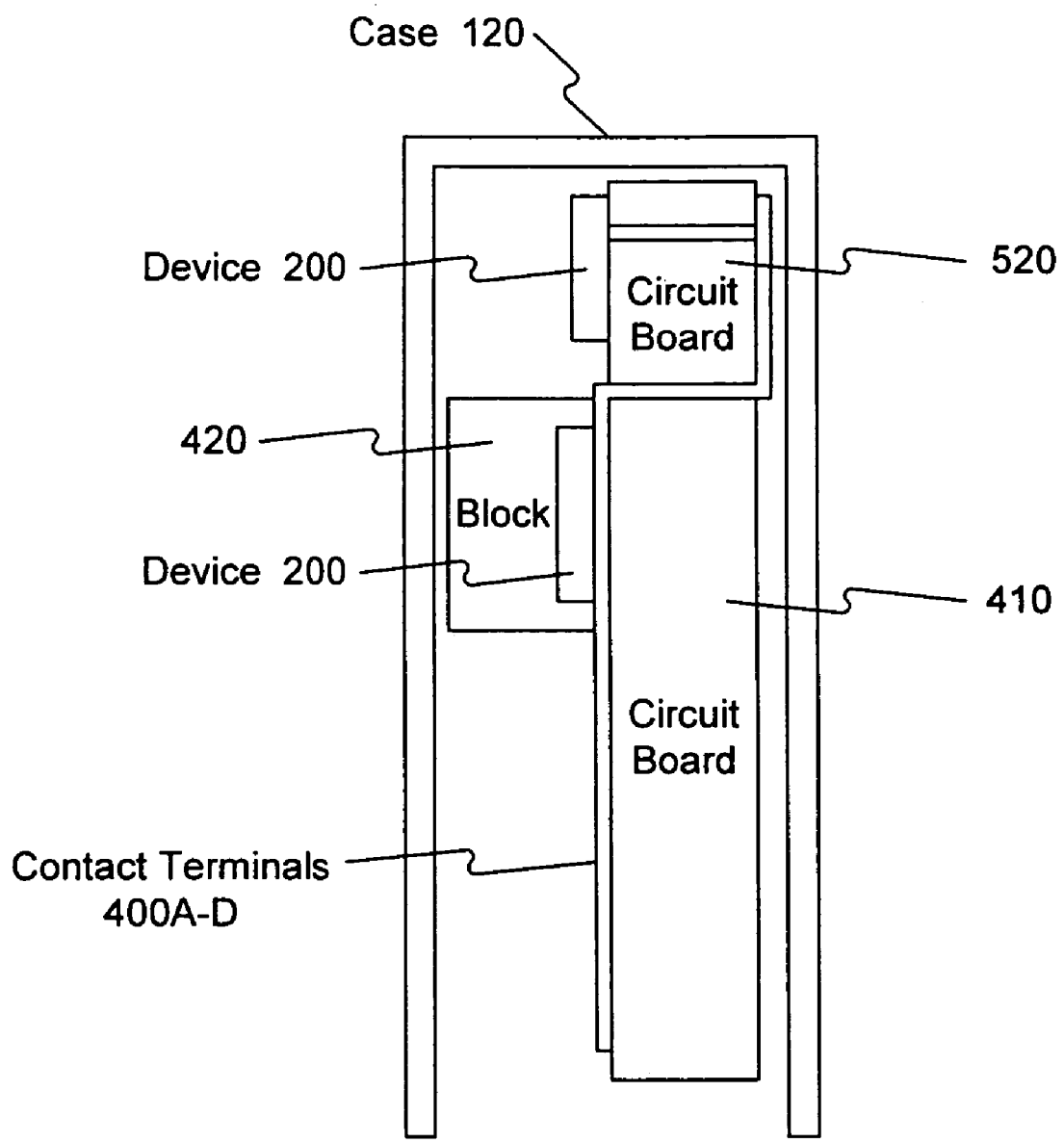
FIG. 5F is a diagram of an exemplary configuration of a first circuit board, a set of contact terminals, a resin block, a second circuit board, and a memory storage semiconductor device having two modules, where one module is mounted within the resin block and the other module collectively making up the device is mounted on the second circuit board according to an embodiment of the present invention.
Figure 5G:
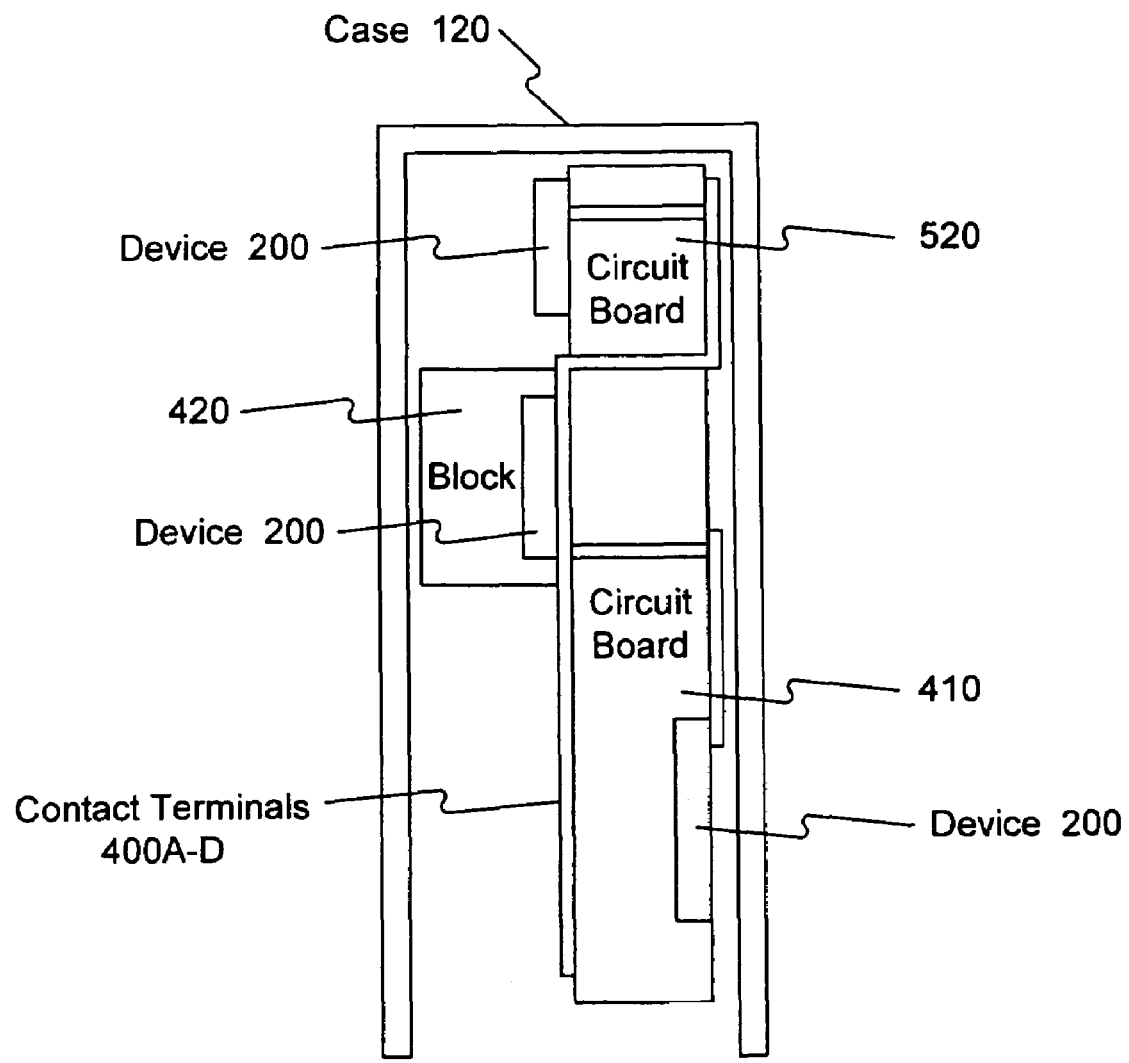
FIG. 5G is a diagram of an exemplary configuration of a first circuit board, a set of contact terminals, a resin block, a second circuit board, and a memory storage semiconductor device having three separate circuit modules, where a first module is mounted within the resin block, a second module is mounted on the bottom side of the first circuit board, and the third module collectively making up the device is mounted on the second circuit board according to an embodiment of the present invention.

FIGS. 5D-H utilizes such a second circuit board. In particular, FIG. 5D shows a diagram of an exemplary configuration of a first circuit board 410, a set of contact terminals 400A-D, a resin block 420, a second circuit board 520, and a memory storage semiconductor device 200 mounted on the second circuit board 520 according to an embodiment of the present invention. In the illustrated embodiment, the contact terminals on the top side of the first circuit board are in electrical communication with the second circuit board 520 as well. In this manner, the set of contact terminals 400A-D are in communication with the device 200 on the second circuit board 520. FIG. 5E shows a configuration where the device 200 is implemented with two modules, one being mounted on the bottom side of the first circuit board 410 and the other being mounted on the second circuit board 520. Similarly, FIG. 5F shows a configuration where the one module is mounted on the second circuit board 520 and the other module is mounted within the block 420. FIG. 5G shows a configuration where the device 200 is implemented with three different modules. The first is mounted on the bottom of the first circuit board 410, the second is mounted within the block 420, and the third is mounted on the second circuit board 520. Thus, the circuit modules that make up device 200 may be mounted in a variety of locations to keep all or a majority of the apparatus' structure within the physical confines of the USB connector shield case.

Figure 5H:
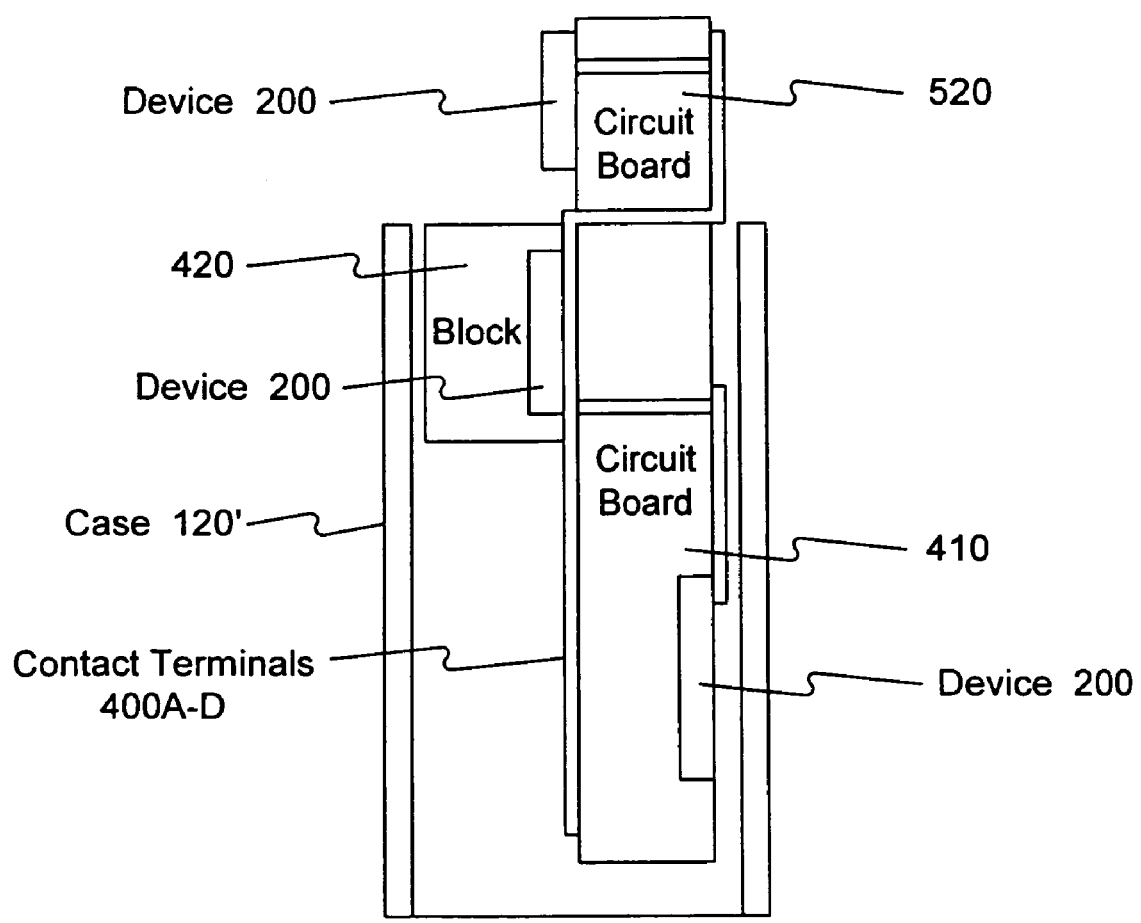
FIG. 5H is a diagram of an exemplary configuration where only a portion of the active circuitry for the memory storage semiconductor device is within the USB connector shield case according to an embodiment of the present invention.

In another embodiment of the present invention, a portion of the active circuitry for the device (e.g., at least one of the circuit modules that implement device 200) may be mounted within the USB connector while the remainder of the active circuitry modules for the device are mounted outside the USB connector. For example, FIG. 5H shows where only a portion of the active circuitry for the memory storage semiconductor device is within the USB connector shield case according to an embodiment of the present invention. Referring now to FIG. 5H, USB connector shield case 120' does not encompass both the first and second circuit boards. Instead, the first circuit board 410 is disposed within case 120' while the second circuit board is mounted outside case 120'. In this manner, a module implementing the controller, the NAND flash memory, the USB interface circuitry or other circuitry necessary to implement device 200 may be advantageously disposed within case 120' while one or more other modules are mounted outside case 120'. In the illustrated embodiment, the module within case 120' may be embedded within block 420 or on the bottom side of first circuit board 410.

Those skilled in the art will appreciate that it is still advantageous to incorporate just the controller, the NAND flash memory, or the USB interface circuitry within case 120' as such an alternative embodiment also allows for a reduced size of a USB flash drive apparatus. In other words, by incorporating the electrical circuit components into a reduced size semiconductor device that is capable of being mounted within the USB connector itself or at least partially within the USB connector, embodiments of the present invention allow a USB flash drive apparatus to be implemented in a dramatically reduced physical space. This allows for a very small, inexpensive, portable and removable storage media that avoids the break off or damage problem associated with prior art USB flash drives having a majority of their structure being outside the USB connector.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory apparatus connectable to a host system having a USB connector, comprising:
   a USB connector shield case which is insertable to the USB connector;
   a plurality of connector terminals disposed in the USB connector shield case, in case of the USB connector being inserted in the USB connector, the terminals being electrically connected to the host system;
   a controller in communication with the connector terminals; and
   a nonvolatile memory in communication with the controller,
   wherein at least one of the controller and the nonvolatile memory is disposed in the USB connector shield case.

2. The memory apparatus according to claim 1, wherein the USB connector shield case is a plug housing from a USB series A plug.

3. The memory apparatus according to claim 2, wherein physical dimensions of the plug housing are substantially 12 millimeters wide by 4.5 millimeters tall by at least 11.75 millimeters deep.

4. The memory apparatus according to claim 1, further comprising a synthesized clock source within the USB connector shield case.

5. The memory apparatus according to claim 1, further comprising a block within the USB connector shield case for preventing over-insertion of the connector.

6. The memory apparatus according to claim 1, further comprising a light operatively coupled to the controller, the light providing a visual indication of access to the nonvolatile memory.

7. A memory apparatus connectable to a host system having a USB connector, comprising:
   a USB connector shield case which is insertable to the USB connector;
   a circuit board disposed in the USB connector shield case;
   a plurality of connector terminals disposed on the circuit board, in case of the USB connector being inserted in the USB connector, the terminals being electrically connected to the host system;
   a controller in communication with the connector terminals; and
   a nonvolatile memory in communication with the controller,
   wherein at least one of the controller and the nonvolatile memory, is disposed on the circuit board.

8. The memory apparatus according to claim 7, wherein the USB connector shield case is a plug housing from a USB series A plug.

9. The memory apparatus according to claim 8, wherein physical dimensions of the plug housing are substantially 12 millimeters wide by 4.5 millimeters tall by at least 11.75 millimeters deep.

10. The memory apparatus according to claim 7, further comprising a synthesized clock source within the USB connector shield case.

11. The memory apparatus according to claim 7, further comprising a block within the USB connector shield case for preventing over-insertion of the connector.

12. The memory apparatus according to claim 7, further comprising a light operatively coupled to the controller, the light providing a visual indication of access to the nonvolatile memory.

* * * * *